United States Patent [19]

Izadian

[11] Patent Number: 5,256,988
[45] Date of Patent: Oct. 26, 1993

[54] CONICAL TRANSVERSE ELECTROMAGNETIC DIVIDER/COMBINER

[75] Inventor: Jamaledin Izadian, San Jose, Calif.

[73] Assignee: Loral Aerospace Corp., New York, N.Y.

[21] Appl. No.: 938,943

[22] Filed: Sep. 1, 1992

[51] Int. Cl.$^5$ .............................. H03F 3/68; H03F 3/60
[52] U.S. Cl. ...................................... 330/295; 330/286
[58] Field of Search ............... 330/277, 286, 295, 307; 333/125, 127, 128, 136, 137

[56] References Cited

U.S. PATENT DOCUMENTS

| | | | |
|---|---|---|---|
| 4,091,334 | 5/1978 | Sechi | 330/286 |
| 4,272,740 | 6/1981 | MacMaster et al. | 333/127 |
| 4,282,492 | 8/1981 | Nichols | 330/286 |
| 4,291,278 | 9/1981 | Quine | 330/286 |
| 4,371,845 | 2/1983 | Pitzalis, Jr. | 330/277 |
| 4,424,496 | 1/1984 | MacMaster et al. | 330/286 |
| 4,835,496 | 5/1989 | Schellenberg et al. | 330/286 X |

OTHER PUBLICATIONS

"Millimeter-Wave Power-Combining Techniques" by Kai Chang: IEEE Transactions on Microwave Theory and Techniques, vol. Mtt-31, No. 2, Feb. 1983.
"An X-Band Single Horn Autotrack Antenna Feed System", by T. Yodokawa, S. Hamada: CH1672-5/81/0000-00086 copyright 1981 IEEE.
"A K-Band GaAs FET Amplifier with 8.2-W Output Power by Jitendra Goel: IEEE Transactions on Microwave Theory and Techniques", vol. MTT-32 No. 3, Mar. 1984.
"30-Way Radial Power Combiner for Miniature GaAs FET Power Amplifiers" by R. Belchoubek, et al., 1986 IEEE MIT-S Digest.
"A 19-Way Isolated Power Divider Via the TE$_{01}$ Circular Waveguide Mode Transition" by M. H. Chen: 1986 IEEE MTT-S Digest.

*Primary Examiner*—Steven Mottola
*Attorney, Agent, or Firm*—Greg T. Sueoka; Edward J. Radlo

[57] ABSTRACT

A conical TEM power divider/combiner (10) comprises an input port (12), a first circular waveguide (14), a coaxial device (16), a plurality of amplifiers (18), a plurality of cooling fins (20), a second circular waveguide (22), an output port (24), a conical dividing waveguide (42, 32), a first parallel plate waveguide (40, 50), a second parallel plate waveguide (40, 52) and a conical combining waveguide (34, 44). The input port (12) is coupled to the first circular waveguide (14). The first circular waveguide (14) is in turn coupled to the coaxial device (16). The coaxial device (16) divides the signal using the conical dividing waveguide (42, 32), a first parallel plate waveguide (40, 50), and a first plurality of striplines (54). The striplines (54) couple the first parallel plate waveguide (40, 50) to the inputs of the plurality of amplifiers (18). The amplifiers (18) each amplify a respective divided signal and output the result to the second the second parallel plate waveguide (40, 52). The signals are recombined by the second parallel plate waveguide (40, 52) and the conical combining waveguide (34, 44). The amplified signal is then transformed to a rectangular mode signal by the second circular waveguide (22) and port (24).

13 Claims, 9 Drawing Sheets

FIGURE.1

FIGURE_2

CONICAL TRANSVERSE ELECTROMAGNETIC DIVIDER/COMBINER

BACKGROUND OF THE INVENTION

1. Field of the Invention

The present invention relates to an apparatus for dividing and combining electromagnetic energy. In particular, the present invention relates to an apparatus for dividing transverse electromagnetic waves into smaller signals, amplifying the smaller signals, and then recombining the amplified signals into a high power microwave source.

2. Description of Related Art

Communication systems require high levels of microwave energy to provide for high data rates and error free reception of signals. The prior art has attempted to satisfy these shortcomings using traveling waveguides, and more recently, solid state devices amplifying devices. However, existing solid state amplifying devices are not effective for producing high energy microwave source signals efficiently. Moreover, equipment capable of providing such high energy levels of microwave power is very expensive, requires excessive amounts of power, and has a short service life.

U.S. Pat. No. 4,091,334, issued to Sechi, discloses a circular waveguide that transitions into an array of radial slot lines coupled to amplification devices. While the device of Sechi may have low loss through the use of circular TE01 mode, the device requires the use of an oversized circular waveguide to convert from rectangular to circular modes. The oversized waveguide also produces the excitation of undesired modes that are difficult to remove. Thus, there is a need for a microwave amplifying device that does not excite undesired modes.

U.S. Pat. No. 4,272,740, issued to MacMaster et al., discloses a device comprising a cylindrical array of transmission lines and bars surrounding a central core. The bars have slots for producing parallel plate TEM modes. The device allows for several approaches for exciting fields in the slots; however, the complexity of manufacturing the device as well as the necessity of coupling either a waveguide or a coaxial line make the device of MacMaster unpractical. Moreover, the device of MacMaster also excites undesired modes.

Other techniques in the present state of the art are also demonstrated by U.S. Pat. Nos. 4,282,492; 4,291,278; 4,371,845; and 4,424,496. Additional techniques of power combining are disclosed in "Millimeter-Wave Power-Combining Techniques," *IEEE Transactions on Microwave Theory*, February 1983, pp. 91–107; "An X-Band Single Horn Autotrack Antenna Feed System," *IEEE*, 1991, pp. 86–89; "30-Way Radial Power Combiner for Miniature GaAs FET Power Amplifiers," *IEEE MTT-S Digest*, 1986, pp. 515–518; "An 19-Way Isolated Power Divider Via the $TE_{01}$ Circular waveguide Mode Transition," *IEEE MTT-S Digest*, 1986, pp. 511–513; and "A K-Band GaAs FET Amplifier with 8.2-W Output Power" *IEEE Transactions on Microwave Theory and Techniques*, March 1984, pp. 317–324.

While the prior art provides several methods and devices for power dividing and combining, these methods are inefficient. The inefficiencies in power combining also limit the number of devices that may be combined and make them unsuitable for combining large numbers of devices. Additionally, the prior art devices are expensive and difficult to manufacture and fabricate. Thus, there is a need for an efficient microwave power divider/combiner that can be manufactured at low cost.

DISCLOSURE OF INVENTION

The present invention overcomes the deficiencies of the prior art by providing a device (10) for simply and efficiently dividing and combining a microwave signal to increase power output. The divider/combiner (10) of the present invention divides electromagnetic power into many smaller signals of equal amplitude and phase, amplifies the smaller signals with a plurality of solid state amplifiers (18), and then recombines them to provide a very high power output.

A preferred embodiment of the divider/combiner (10) of the present invention comprises an input port (12), a first circular waveguide (14), a coaxial device (16), a plurality of amplifiers (18), a plurality of cooling fins (20), a second circular waveguide (22) and an output port (24). The input port (12) is coupled to the first circular waveguide (14). The first circular waveguide (14) is in turn coupled to the coaxial device (16). The coaxial device (16) preferably comprises a conical dividing waveguide (42, 32), a first parallel plate waveguide (40, 50), a second parallel plate waveguide (40, 52) and a conical combining waveguide (34, 44). The coaxial device (16) divides the signal with conical dividing waveguide (42, 32), a first parallel plate waveguide (40, 50), and a first plurality of striplines (54). The striplines (54) couple the output of the first parallel plate waveguide (40, 50) to the inputs of the plurality of amplifiers (18). The amplifiers (18) each amplify a respective divided signal and output the result to the second parallel plate waveguide (40 52) through a second plurality of striplines (54). The signals are recombined by the second parallel plate waveguide (40, 52) and the conical combining waveguide (34, 44). The amplified signal is then transformed to a rectangular mode signal by the second circular waveguide (22) and output port (24).

The present invention divides a single rectangular $TE_{10}$ mode input to a large number of quasi-TEM microstrip modes using the conical dividing waveguide (42, 32) and the first parallel plate waveguide (40, 50). The amplifiers (18) amplify the large number of quasi-TEM microstrip modes. Once amplified, the modes are recombined by transitioning from the TEM mode in the conical combining waveguide (34, 44) to the $TM_{01}$ mode in the second circular waveguide (22) and then to the $TE_{10}$ mode in the rectangular output port (24).

DETAILED DESCRIPTION OF THE PREFERRED EMBODIMENTS

Figure 1:
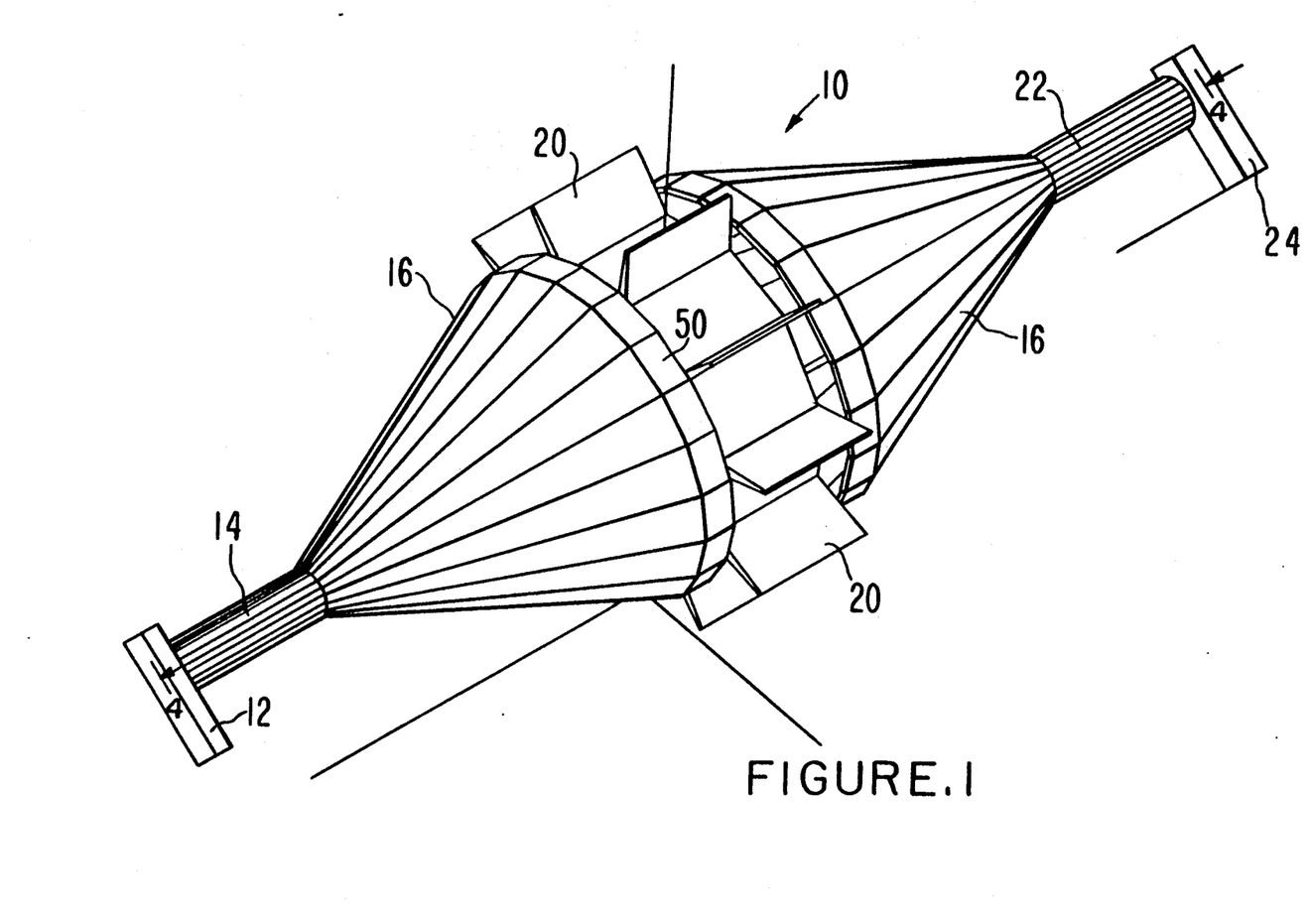
FIG. 1 is a perspective view of a preferred embodiment of the conical divider/combiner of the present invention.

Referring now to FIG. 1, a preferred embodiment of the conical transverse electromagnetic (TEM) divider/combiner 10 of the present invention is shown. The conical TEM divider/combiner 10 preferably comprises an input port 12, a first circular waveguide 14, a conical coaxial device 16, a plurality of amplifiers 18, a plurality of cooling fins 20, a second circular waveguide 22 and an output port 24. The power divider/combiner 10 of the present invention receives a microwave source signal at the input port 12. The $TE_{10}$ mode in the rectangular input port 12 transitions to a $TM_{01}$ mode in the first circular waveguide 14 and then to the TEM mode in the coaxial device 16. Thus, the present invention divides a single rectangular $TE_{10}$ mode input to a large number of quasi-TEM microstrip modes. The amplifiers 18 are coupled to the output divided ports 55 of the coaxial device 16 divided to the transition of FIG. 6 to amplify the large number of quasi-TEM microstrip modes. Once amplified, the modes are similarly recombined by transitioning from the TEM mode in the conical coaxial device 16 to the $TM_{01}$ mode in the second circular waveguide 22 and then to the $TE_{10}$ mode in the rectangular output port 24.

The input port 12 and the output port 24 are preferably rectangular waveguides conventional in the art. The ports 12, 24 are suitable for the transmission of the $TE_{10}$ modes. The input port 12 and output port 14 are coupled to the first and second circular waveguides 14, 22, respectively. The present invention is particularly effective because instead of trying to twist or bend electromagnetic fields, the input and output ports 12, 24 are coupled with their longitudinal axes perpendicular to the longitudinal axes of the first and second circular waveguides 14, 22, respectively. Thus, the present invention takes advantage of the natural transition from $TE_{10}$ in the rectangular waveguide to the $TM_{01}$ mode in the circular waveguide 14, 22, and vice versa.

Figure 4:
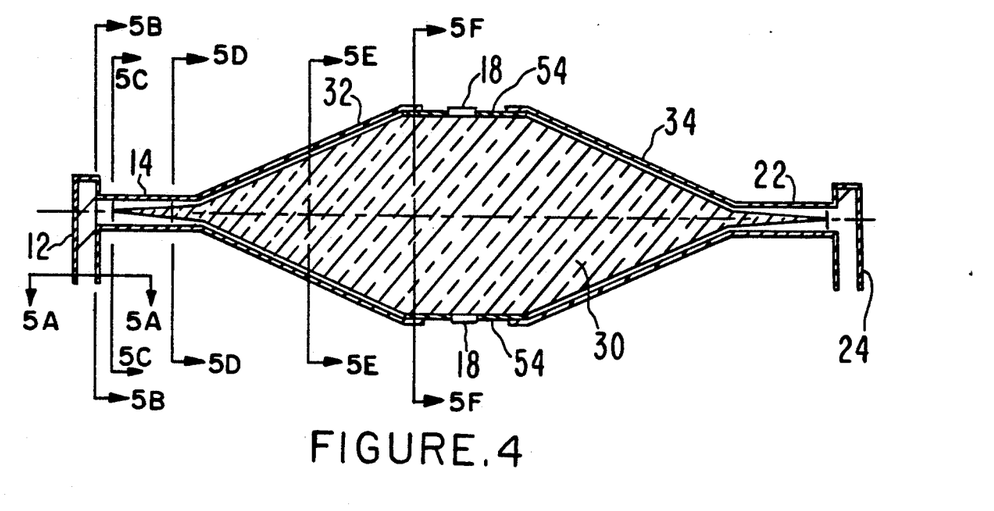
FIG. 4 is cross-sectional view of the preferred embodiment of the conical divider/combiner taken along line 4—4 of FIG. 1.
Figure 5A:
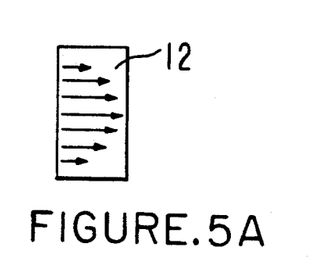
FIGS. 5A-5F are cross-sectional views of transverse electro-magnetic waves and the preferred embodiment of the conical divider/combiner of the present invention taken along lines 5A—5A, 5B—5B, 5C—5C, 5D—5D, 5E—5E, respectively, of FIG. 3.
Figure 5B:
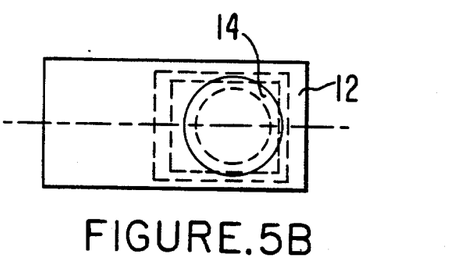
Figure 5C:
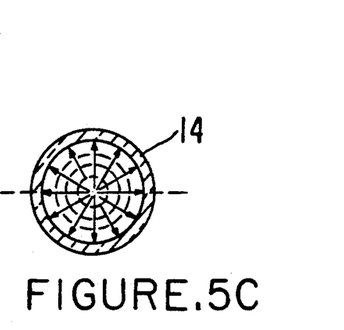
Figure 5D:
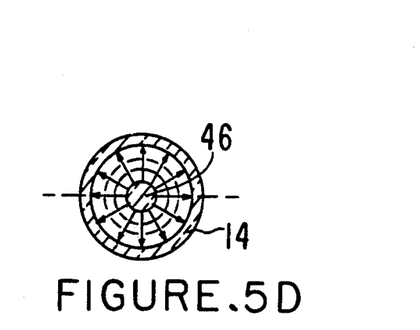
Figures 5E, 5F:
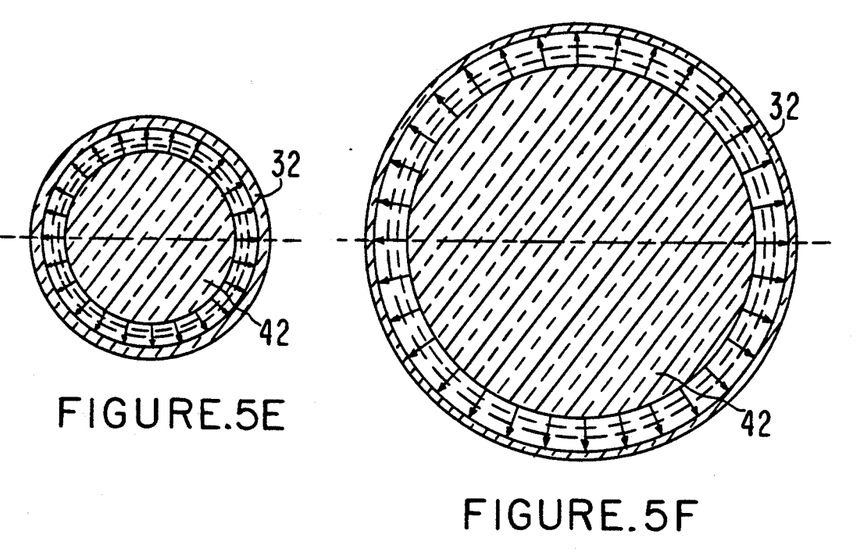

As illustrated in FIGS. 1 and 4, the first circular waveguide 14 is coupled between the input port 12 and the conical coaxial device 16. The second circular waveguide 22 is coupled between the conical coaxial device 16 and the output port 24. The first and second circular waveguides 14, 22 are conventional types known in the art for transmission of $TM_{01}$ modes.

Figure 2:
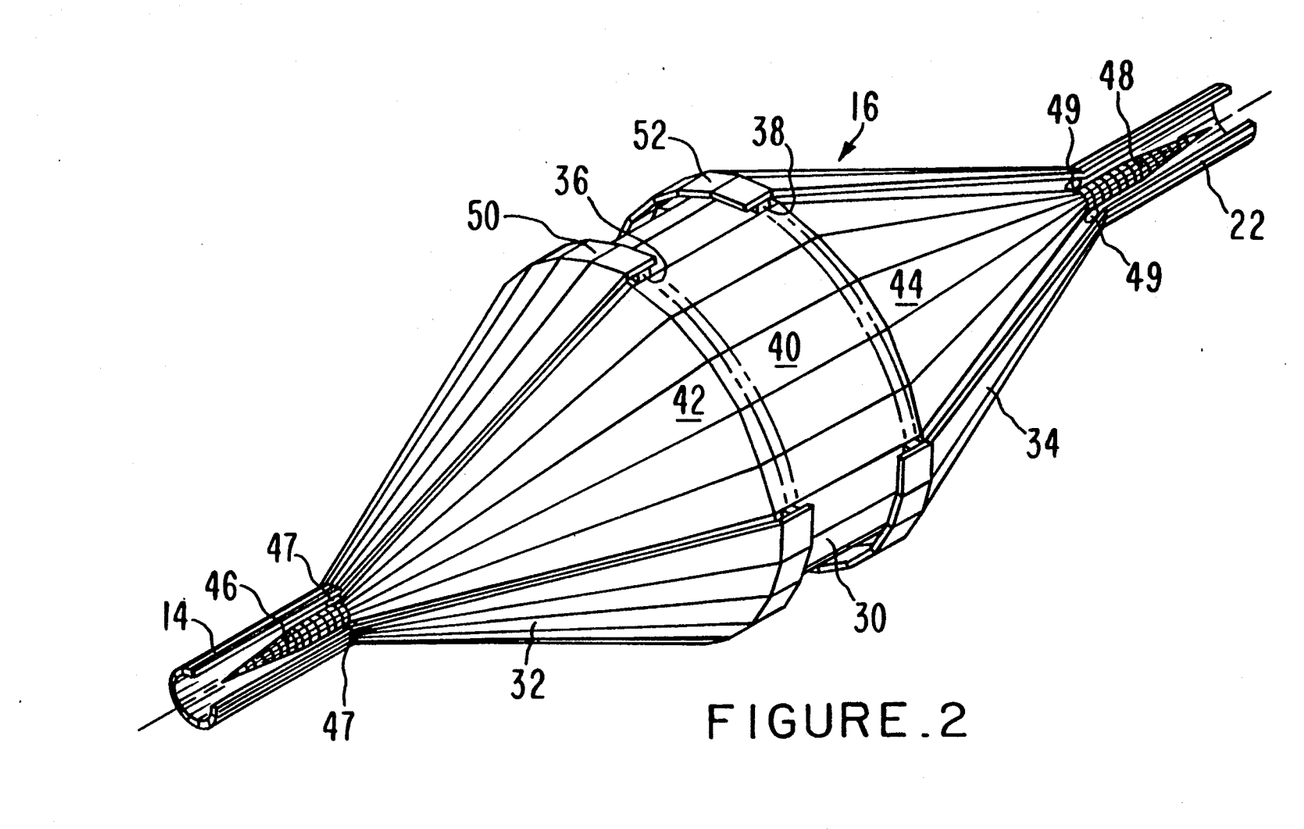
FIG. 2 is a perspective view, partially in section, of a preferred embodiment of the inner and outer conductors of the conical divider/combiner of present invention.

Referring now to FIG. 2, the coaxial device 16 comprises an inner conductor 30, a dividing outer conductor 32, a combining outer conductor 34 and a pair of spacers 36, 38. The inner and outer conductors 30, 32, 34 advantageously also avoid the excitation of higher order modes (i.e., circumferentially propagating electromagnetic waves) with the rotationally symmetric shape of the inner and outer conductors 30, 32, 34. Moreover, the shapes of the inner and outer conductors 30, 32, 34 are inexpensive and straight forward to manufacture.

The inner conductor 30 preferably has a substantially back-to-back cone shape. For example, the inner conductor 30 is formed from a cylindrical central section 40, and a pair of two-part cone structures 42, 44, 46, and 48. Each two-part cone structure has a bottom section 42, 44 and an acute section 46, 48 mounted thereon. As best seen in FIG. 2, a base of one two part cone structure 42 is mounted to a side of the central section 40, and a base of the other two-part cone structure 44 is mounted to the other side of the central section 40. The bases of the two-part cone structures 42, 44 are sized to match the diameter of the central section 40. The divider/combiner can be sized to accomodate any number of amplifiers 18 by adjusting the circumference of the central section 40 and the cone structures 42, 44, 46, 48 accordingly. The inner conductor 30 is preferably constructed using milling, electroplating, carbon epoxy techniques with sputtered gold plating. Additionally, it should be noted that the inner conductor 30 may be either hollow or solid.

The dividing outer conductor 32 preferably has a funnel shape sized to fit closely over bottom section 42. Together the outer conductor 32 and the bottom section 42 form a conical coaxial dividing waveguide. A small end of outer conductor 32 is coupled to first circular waveguide 14 distal the input port 12. A large end of outer conductor 32 provides a cylindrical band 50 for mounting outer conductor 32 to the inner conductor 30. The band 50 provides a close fit with the central section 40. The dielectric spacer 36 is used to mount the band 50 to the central section 40 of the inner conductor 30. The spacer 36 is preferably constructed of light dielectric such as a ring of teflon, and maintains uniform spacing between the outer conductor 32 and the bottom section 42. Thus, it can be seen that structure 40,50 constitutes a plurality of local parallel plate waveguides arranged in a ring or band.

Similarly, the combining outer conductor 34 preferably has a funnel shape sized to fit closely over bottom section 44. Together the outer conductor 34 and the bottom section 44 form a conical combining waveguide. The small end of outer conductor 34 is coupled to the second circular waveguide 22 distal the output port 24. The large end of outer conductor 34 provides a cylindrical band 52 for mounting to the inner conductor 30. The band 52 provides a close fit with the central section 40. Another spacer 38 is used to mount the band 52 to the central section 40 of the inner conductor 30 distal the combining conductor 32. Like spacer 36, spacer 38 maintains uniform spacing between the outer conductor 34 and the inner conductor 30 and has a similar construction. Thus, it can be seen that structure 40,52 constitutes a plurality of local parallel plate waveguides arranged in a ring or band.

As illustrated, the acute sections 46, 48 of the inner conductor 30 extend into the first and second circular waveguides 14, 22, respectively. Thus, the distance between the inner conductor 30 and the waveguide 14 is decreased until a predetermined minimum is reached at the base of acute sections 46, 48. The predetermined minimum distance is then maintained between the outer conductor 32 and the inner conductor 30 in the conical waveguide areas. The minimum distance is maintained by a pair of dielectric spacers 47, 49 mounted between the inner conductor 30 and the outer conductors 32, 34, respectively. The spacers 47, 49 are preferably rings mounted proximate their respective acute sections 46, 48.

Figure 3:
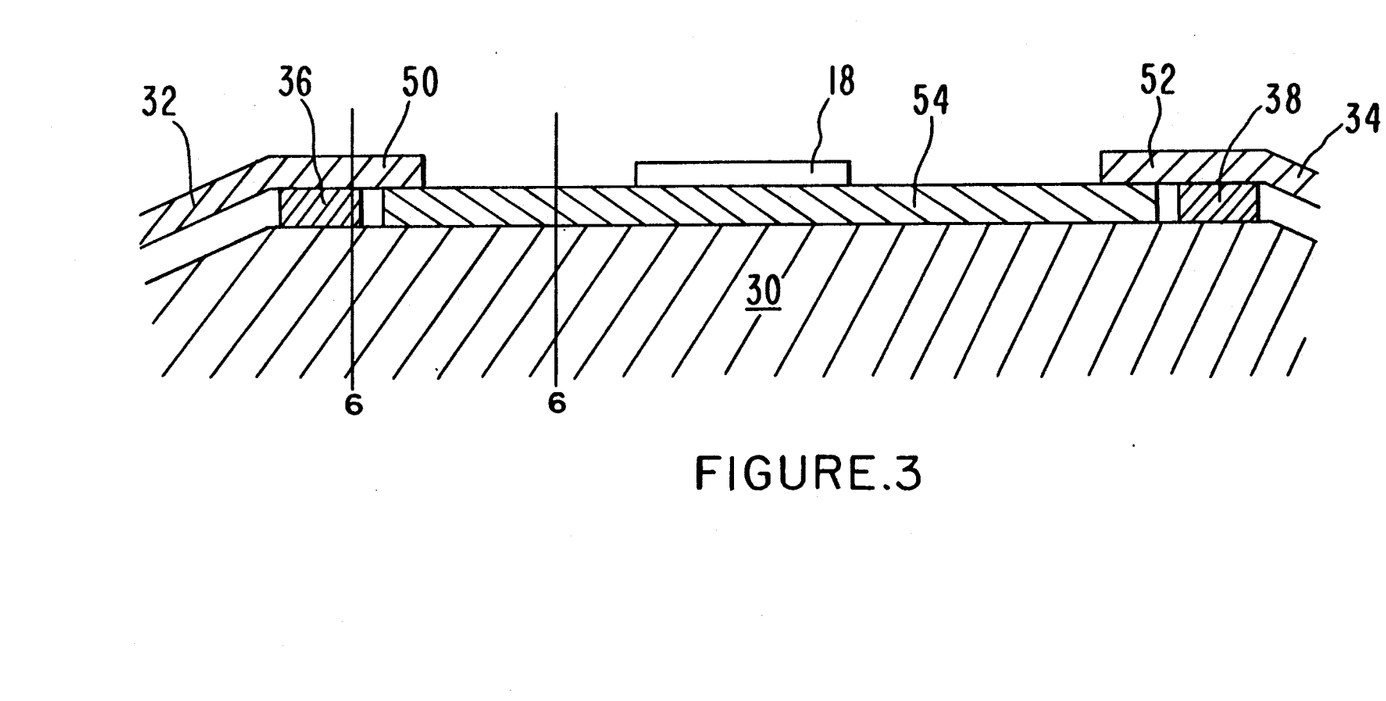
FIG. 3 is a partial cross-sectional view of the preferred embodiment of the amplifier and stripline mounted on the inner conductor of the present invention.

As shown by FIG. 3, the spacers 36, 38 advantageously maintain a uniform separation between the inner conductor 30 and the outer conductors 32, 34. The spacers 36, 38 fit under the band 50, 52 and on the central section 40. The distance between the inner conductor 30 and the outer conductors 32, 34 is uniform as the cone shaped conductors 30, 32, 34 taper outward and thus, eliminates higher order modes from the signal. The outer surface area of the central section 40 is preferably sized to accomodate cooling fins 20, amplifiers 18, and a plurality of striplines 54. As best shown by FIG. 1, the cooling fins 20 are mounted to the central section 40 and extend radially outward to dissipate heat produced by the amplifiers 18. The bands 50, 52 also extend to cover a portion of the central section 40 beyond the spacers 36, 38. As shown in FIG. 3, the bands 50, 52 extend over a portion of stripline 54 mounted about the central section 40 to form local parallel plate waveguides. The stripline 54 preferably has a thickness about the same as spacers 36, 38 and is constructed of microstrip line.

Figure 6:
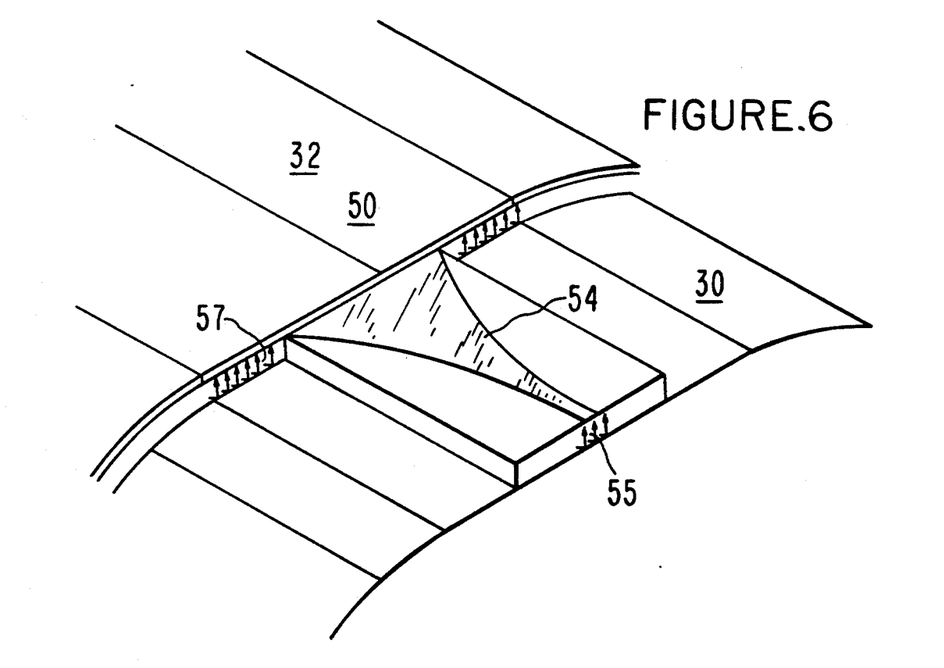
FIG. 6 is a perspective view, partially in section, of a preferred embodiment for the impedance matching stripline.
Figure 7:
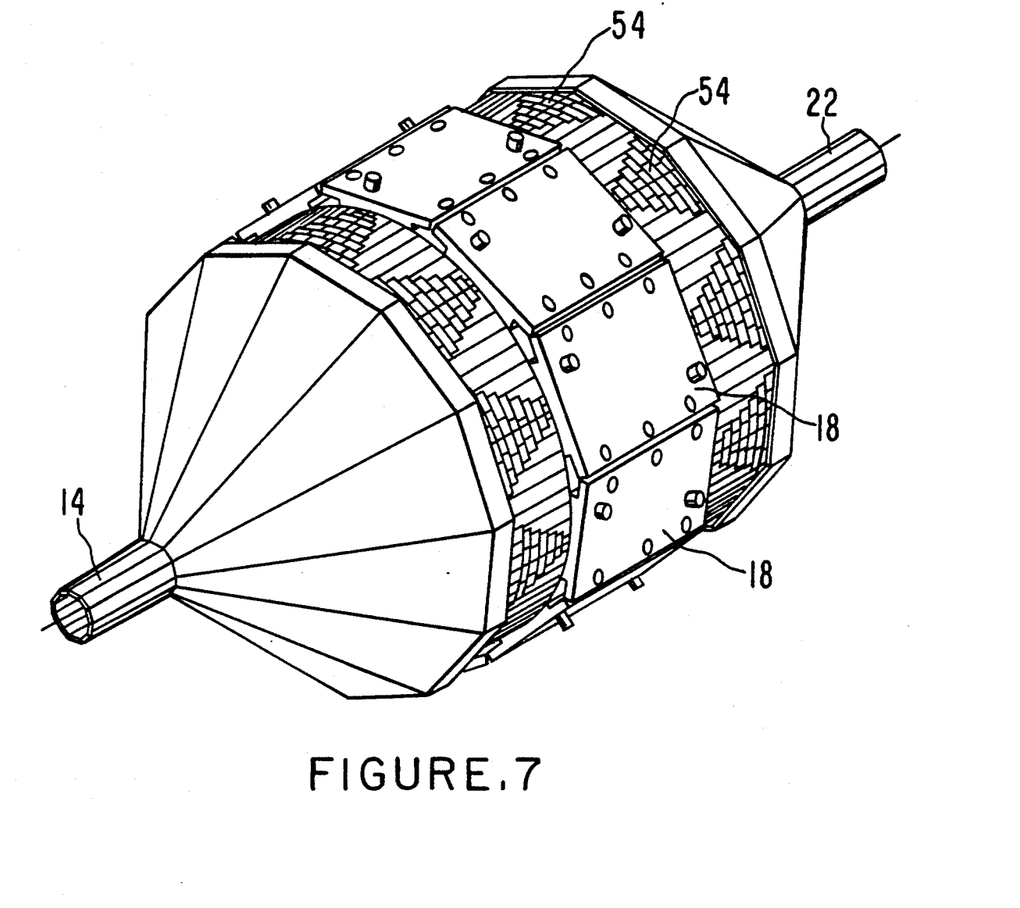
FIG. 7 is a perspective view of a second embodiment of the present invention including MMICs and stripline packaged amplifiers.

For similar technology, a preferred embodiment for a first plurality of striplines 54 is shown in FIG. 6. The stripline 54 is preferably a continuous taper for impedance matching between the cylindrical coaxial TEM and the amplifier 18. The degree of the taper is preferably determined using a Bessel-Chebyshev binomial for impedance matching. The stripline 54 may also be a multi-section step transition as shown in FIG. 7. The use of microstrip line is advantageous because it eliminates the high cost of precision machining with inexpensive photolithography techniques to address the intricate details of the transmission line impedance matching. Proximate the other band 52, the second plurality of striplines 54 have a similar shape, but with the taper having an opposite orientation The second plurality of striplines 54 are narrow near the amplifiers 18 and wide as they extend to the band 52.

The plurality of amplifiers 18 are then mounted on and coupled using the stripline 54. In the preferred embodiment the amplifiers 18 are either monolithic microwave integrated circuits (MMIC), microwave integrated circuits (MIC) or diode amplifiers as known in the art. The present invention is particularly advantageous because the cylindrical TEM nature of the electromagnetic wave on the central section 40 provides a natural medium for integrating MMICs, MICs or diode amplifiers. Soft substrates, such as RT/duroid amplifier arrays, can be conformed to the cylindrical central section 40. The central section 40 can accomodate the amplifiers 18 in chip form, on a microstrip substrate, or as a stripline packages 18 as shown in FIG. 17. The amplifiers 18 are preferably in microstrip medium operating in quasi-TEM substantially similar to the TEM mode. The structure is therefore already field matched.

Referring now to FIGS. 4 and 5, the dividing, amplifying and combining of the signal by the present invention will be described. These Figures demonstrate that the present invention has a high combining efficiency because it uses the natural flow of the fields in their desired geometries without significant distortion and loss. FIG. 4 illustrates the path of the microwave signals through the divider/combiner 10 of the present invention. FIGS. 5A-5E are cross-sectional views taken along various points along the divider/combiner 10 and illustrate the geometry of the electric field with arrows and the magnetic field with dashed lines. The signal begins in the rectangular waveguide of input port 12. As shown in FIG. 5A, a single rectangular $TE_{10}$ mode signal is input and travels through input port 12 toward the circular waveguide 14. As shown in FIGS. 5B and 5C, the present invention uses the natural transition from the $TE_{10}$ mode in the input port 12 to the $TM_{01}$ mode in the circular waveguide 14. Then the $TM_{01}$ mode in the circular waveguide 14 is transformed into a coaxial TEM mode as shown in FIG. 5D. As illustrated in FIGS. 5E, the outer conductor 32 and the bottom section 42 of the inner conductor 30 are gradually enlarged to a conical coaxial TEM mode operation. The conductors 32, 42 are enlarged until they are sized to accomodate the amplifiers 18 where the waveguide is a cylindrical coaxial with local parallel plate waveguide for TEM mode transmission as shown in FIG. 5F. The signals are then divided to many ports 57 according to FIG. 6 and amplified using the stripline 54 and the amplifier 18. The signals are then recombined using a similar structure with the components in reverse order. The present invention accomplishes all these transitions without changing the polarization or natural direction of the electric field as shown in FIGS. 5A-5F. Throughout the divider/combiner 10, the electric field is radial and substantially transverse. Even in the final stage where the microstrip quasi-TEM is needed, the transition is done by tapering the microstrip substrate from the local parallel plate to a microstrip.

As illustrated by FIGS. 5A-5F, the present invention provides a true distributed current structure, where due to the circumferentially uniform distribution of the electromagnetic fields, the currents on the outside of inner conductor 30 and the inside of outer conductors 32, 34 have a circumferentially uniform distribution and flow longitudinally parallel to the cylindrical axis of the central section 40. This provides an efficient way to bunch the currents of the inner and outer conductors 30, 32, 34 through the microstrip tapers 54 to gradually confine the currents to flow only on the striplines 54 of FIG. 6. The circumferential uniform distribution and flow longitudinally also allow for integration of amplifier chips directly in the path of the currents.

Figure 8:
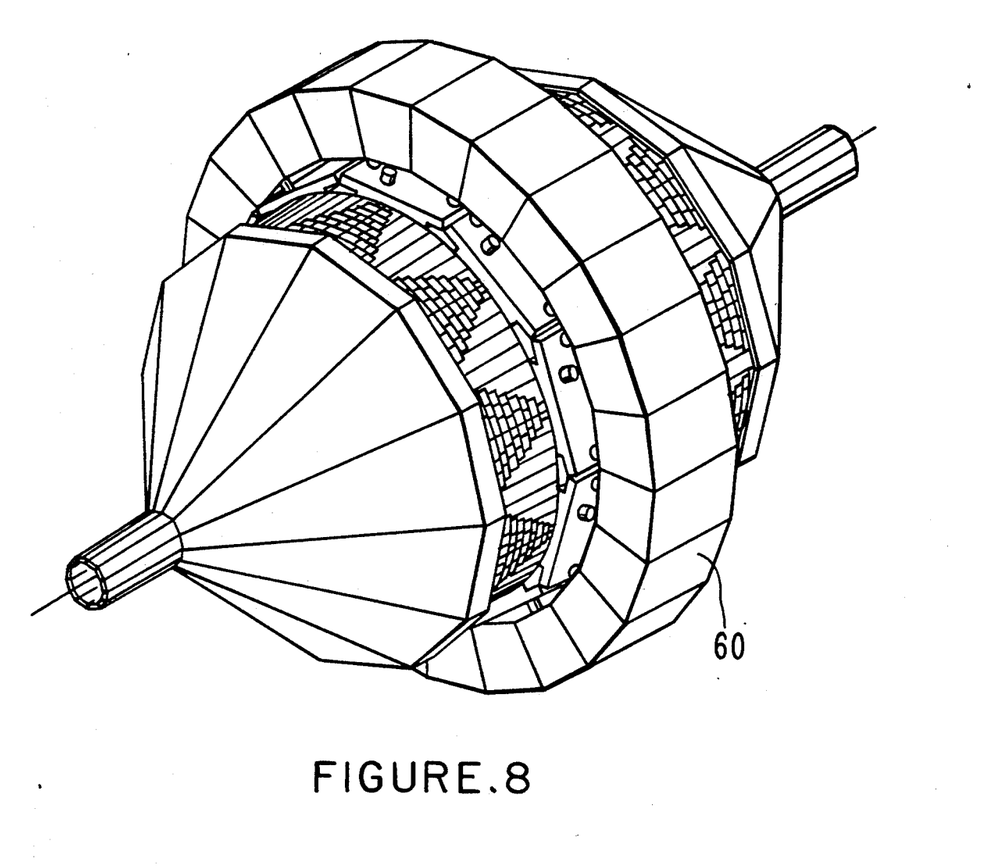
FIG. 8 is a perspective view of the second embodiment of the present invention with conduction cooling.

Referring now to FIGS. 7 and 8, a second embodiment of the present invention is shown. In the second embodiment, the amplifiers 18 are stripline packages. As shown in FIG. 7, the packages are mounted about the circumference of the central portion 40. The stripline packages 18 are mounted upside down to have direct access to the heat generated by transistor junctions without any additional grounding requirements. FIG. 7 also illustrates an alternate form for the stripline 54. Instead of a tapered shape, the stripline 54 is a multi-section step transition. As illustrated in FIG. 8, conduction cooling 60 may be used instead of cooling fins 20 to remove excess heat produced by the amplifiers 18.

Figure 9:
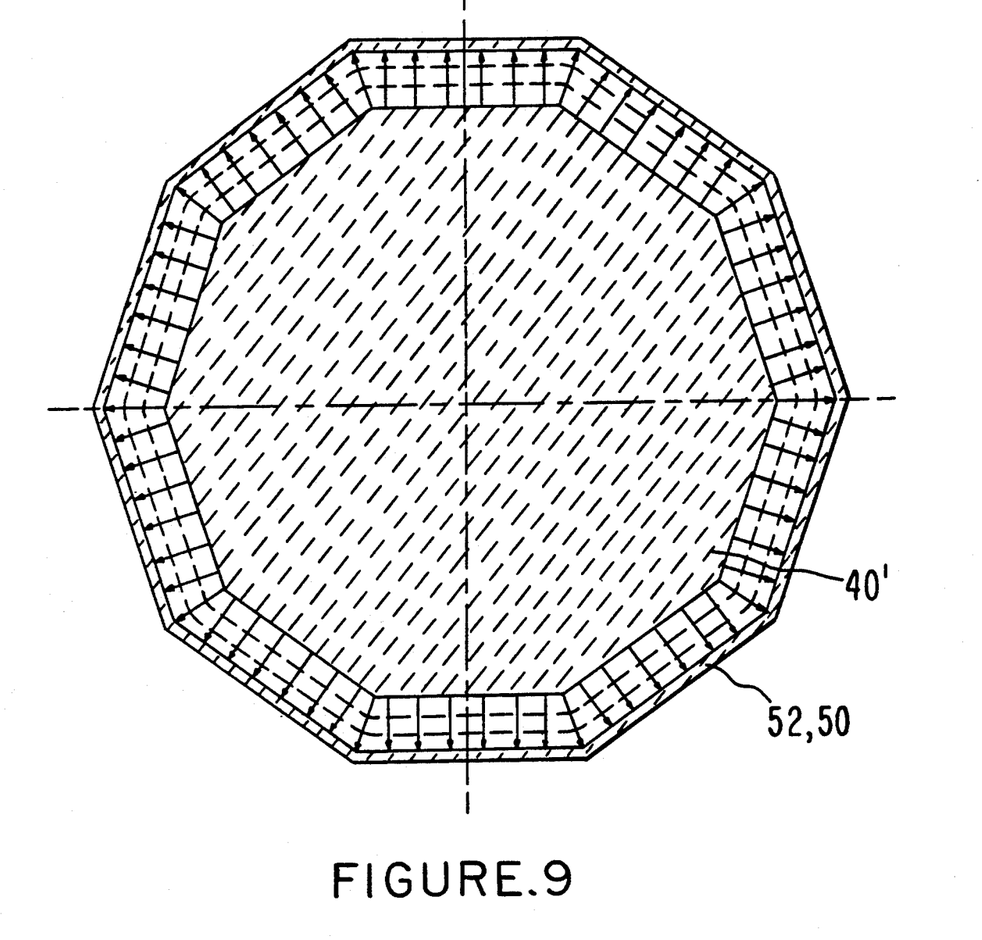
FIG. 9 is a cross sectional view of an embodiment of the present invention with a polygon shaped central section.

While the present invention has been described as providing a cylindrical central section 40, the central section may also have a polygon shape. A cross-section of an alternate shape for the central section 40 and the transition of the bands 50, 52 is shown in FIG. 9. Because the transitions between modes are straightforward and do not disturb the TEM nature of the electromagnetic wave throughout the divider/combiner 10, a simple transition to a polygon shaped central section 40 is used. The polygon central section 40 is particularly advantageous because it provides better mounting for hard substrate microstrip amplifiers such as Alumina and packaged amplifiers. This provides better grounding of the amplifiers 18.

Figure 10:
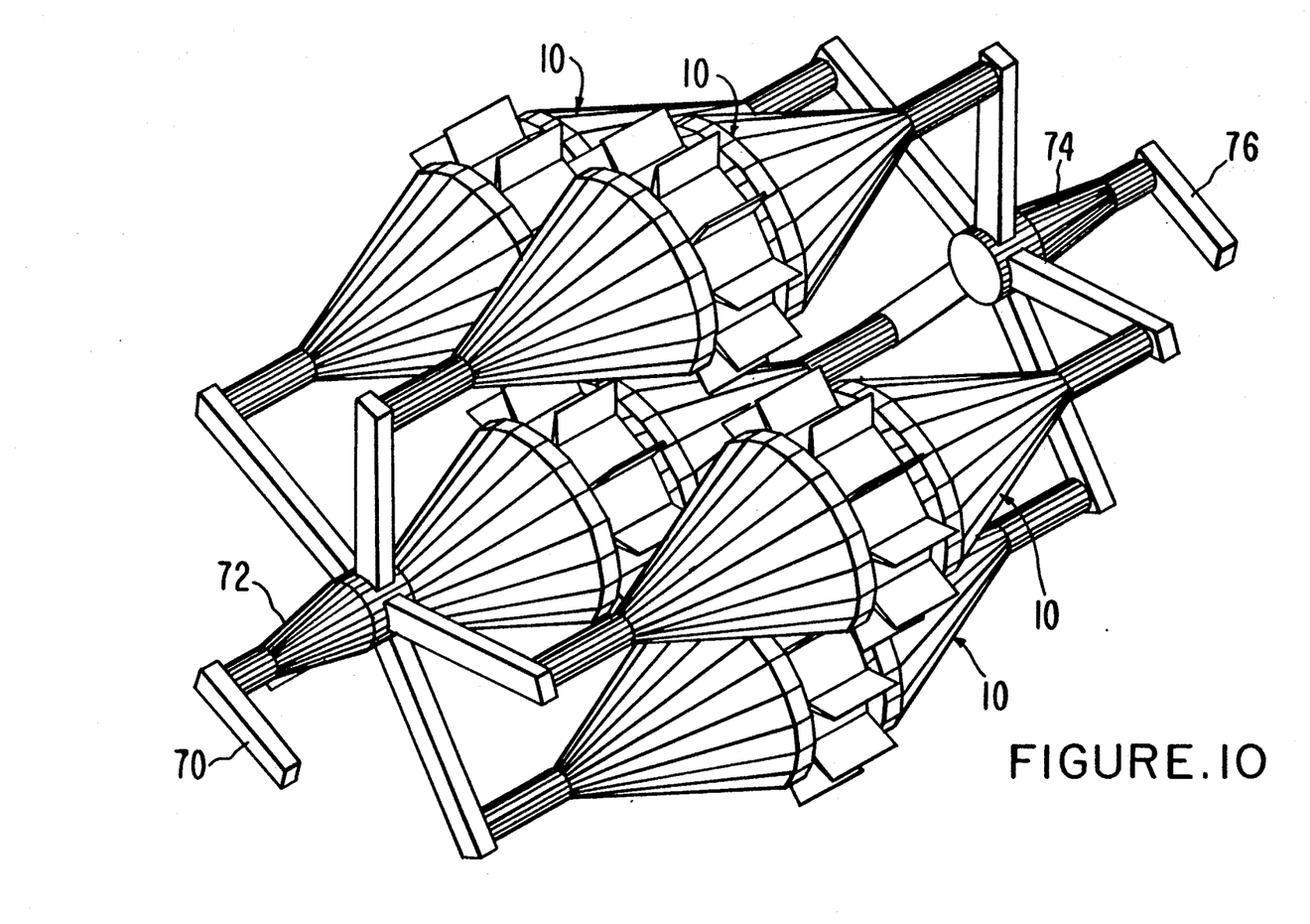
FIG. 10 is a perspective view of a third embodiment of the present invention as a 5-way combiner with another level of combining for additional power amplification.

The third embodiment is a solid state power amplifier using a plurality of divider/combiners 10. The third embodiment comprises an input port 70, a conical divider 72, a conical combiner 74, and an output port 76. The input port 70 is preferably a rectangular waveguide, and is coupled to the input of the conical divider 72. The conical divider 72 is constructed similar to the dividing portion of the divider/combiner 10 of the present invention. The five outputs of the conical divider 72 are coupled to the input ports 12 of five divider/combiners 10 constructed according to the present invention. The amplified signals produced by the five divider/combiners 10 are then fed to the conical combiner 74 coupled to the outputs of the divider/combiners 10. The signals are recombined by the conical combiner 74 and output by the output port 76 which is preferably a rectangular waveguide.

Having described the present invention with reference to specific embodiments, the above description is intended to illustrate the operation of the preferred embodiments and is not meant to limit the scope of the invention. The scope of the invention is to be delimited only by the following claims. From the above discussion, many variations will be apparent to one skilled in the art that would yet be encompassed by the true spirit and scope of the present invention. For example, those skilled in the art will realized that coaxial line input and output ports may be used in place of the input and output ports 12, 24.

What is claimed is:

1. An apparatus for amplifying a microwave source signal, said apparatus comprising:
   a first circular waveguide having an input and an output for transmitting $TM_{01}$ mode signals and converting them to coaxial TEM mode signals;
   a conical dividing waveguide having an input and an output for transmitting conical TEM mode signals, the input of the conical dividing waveguide coupled to the output of the first circular waveguide;
   a first ring having an input and an output for transmitting TEM mode signals, the input of the first ring coupled to the output of the conical dividing waveguide, said first ring comprising a plurality of local parallel plate waveguides arranged in a band;
   a plurality of amplifiers, each amplifier having an input and an output;
   a first plurality of striplines coupling the inputs of the plurality of amplifiers to the output of the first ring;
   a second ring having an input and an output for transmitting TEM mode signals, said second ring comprising a plurality of local parallel plate waveguides arranged in a band;
   a second plurality of striplines coupling the outputs of the plurality of amplifiers to the input of the second ring;
   a conical combining waveguide having an input and an output for transmitting TEM mode signals, the input of said conical combining waveguide coupled to the output of the second ring; and
   a second circular waveguide having an input and an output for converting coaxial TEM mode signals to $TM_{01}$ mode signals, the input of the second circular waveguide coupled to the output of the conical combining waveguide.

2. The apparatus of claim 1, wherein the conical dividing waveguide comprises an inner conductor having a conical shape and an outer conductor having a funnel shape, the inner conductor mounted partially within the outer conductor with a substantially uniform spacing between the inner conductor and the outer conductor.

3. The apparatus of claim 1, wherein the conical combining waveguide comprises an inner conductor having a conical shape and an outer conductor having a funnel shape, the inner conductor mounted partially within the outer conductor with a substantially uniform spacing between the inner conductor and the outer conductor.

4. The apparatus of claim 1, wherein the first and second rings are formed from first and second bands, respectively, and a central portion, said central portion having a cylindrical shape, said first and second bands each having a circular shape and mounted about opposite ends of the central portion with substantially uniform spacing between said first and second bands and said central portion.

5. The apparatus of claim 4, further comprising first and second annular structure, the first annular structure adapted for mounting the first band to the central portion and the second annular structure adapted for mounting the second band to the central portion.

6. The apparatus of claim 4, wherein the plurality of amplifiers, the first plurality of striplines, and the second plurality of striplines are mounted on the central portion.

7. The apparatus of claim 1, wherein the amplifiers are constructed of one from the group of monolithic microwave integrated circuits (MMICs), microwave integrated circuits (MIC), and diode amplifiers.

8. The apparatus of claim 1, further comprising a plurality of fins for removing heat from the amplifiers, said plurality of fins mounted to the amplifiers with each fin positioned between two adjacent amplifiers.

9. The apparatus of claim 1, further comprising conduction cooling for removing heat from the amplifiers, said conductors cooling attached to the amplifiers.

10. The apparatus of claim 1, wherein each of the first plurality of striplines tapers from the first ring to the input of the amplifiers.

11. The apparatus of claim 1, wherein each of the second plurality of striplines tapers from the second ring to the output of the amplifiers.

12. The apparatus of claim 1, wherein each of the first and second plurality of striplines are multi-section step transitions.

13. The apparatus of claim 1, further comprising input and output ports for transmitting $TE_{10}$ mode signals, the input port coupled to the first circular waveguide and the output port coupled to the second circular waveguide.

* * * * *